United States Patent [19]

Fowler et al.

[11] Patent Number: 4,942,437

[45] Date of Patent: Jul. 17, 1990

[54] ELECTRON TUNED QUANTUM WELL DEVICE

[75] Inventors: Alan B. Fowler, Yorktown Heights, N.Y.; Gregory L. Timp, Farmingdale, N.J.

[73] Assignee: International Business Machines Corporation, Armonk, N.Y.

[21] Appl. No.: 298,241

[22] Filed: Jan. 13, 1989

Related U.S. Application Data

[63] Continuation of Ser. No. 110,611, Oct. 20, 1987, abandoned, which is a continuation-in-part of Ser. No. 854,635, Apr. 22, 1986, abandoned.

[51] Int. Cl.$^5$ ............................................. H01L 29/161
[52] U.S. Cl. ........................................ 357/16; 357/22; 357/58
[58] Field of Search ............................... 357/16, 22, 58

[56] References Cited

U.S. PATENT DOCUMENTS 4,163,237  7/1979  Dingle et al. ...................... 357/22 A
4,550,330  10/1985  Fowler .............................. 357/16

FOREIGN PATENT DOCUMENTS 58-147169  9/1983  Japan .............................. 357/22 MP
59-28383   2/1984  Japan .............................. 357/22 MP

OTHER PUBLICATIONS

Physical Review Letters, vol. 52, No. 2, Jan. 1984, p. 129, "Quantum Oscillations and the Aharonov–Bohm Effect for Parallel Resistors", by Gefen et al.

IBM Journal of Research and Development, vol. 1, No. 3, Jul. 1957, p. 223, "Spatial Variation of Currrents and Fields Due to Localized Scatterers in Metallic Conduction", by R. Landauer.

Appl. Phys. Lett. 48 (7), Feb. 17, 1986, p. 487, "Proposed Structure for Large Quantum Interference Effects", by S. Datta et al.

Primary Examiner—Joseph E. Clawson, Jr.
Attorney, Agent, or Firm—Thomas J. Kilgannon, Jr.

[57] ABSTRACT

A quantum well type signal translating device is constructed by providing an appendage in which a reflected wave can be employed to introduce constructive or destructive interference in electron wave conduction at the heterojunction.

1 Claim, 1 Drawing Sheet

ELECTRON TUNED QUANTUM WELL DEVICE

This application is a continuation of application Ser. No. 07/110,611 filed Oct. 20, 1987, which is a continuation of application Ser. No. 06/854,635 filed Apr. 22, 1986, both now abandoned.

DESCRIPTION

1. Technical Field

There are signal devices wherein the signal current is through carriers in a quantum well. Such devices require very little physical space and dissipate very small amounts of energy. This invention is in electrostatic control of current in the quantum well type of signal device.

2. Background Art

One quantum well type of signal device structure described in U.S. Pat. No. 4,550,330 employs an electrostatic field to control a traveling wave of carriers in the quantum well and the signal is developed by the relationship of the phase of the traveling wave with respect to a bifurcated conductor.

Another quantum well type signal device structure described in Physical Review Letters 52, No. 2, January 1984, p. 129, employs a magnetic field to control carriers in the quantum well with the signal being sensed using a bifurcated conductor.

Still another quantum well type structure that uses an electrostatic field to produce interference effects in conductance is described in Appl. Phys. Lett. 48 (7), Feb. 17, 1986, p. 487.

DISCLOSURE OF THE INVENTION

In accordance with the invention a reflected wave produced in an appendage to a conductor in a quantum well type device provides constructive or destructive interference to a traveling wave in the quantum well.

For clarity of explanation, the invention will be illustrated in terms of the control of a traveling wave of the carriers in the quantum well in a semiconductor heterojunction, with the appendage being a tuned stub on a conductor positioned on the surface over the quantum well and the reflected wave being modified or controlled by an electrostatic field. It will, however, be apparent to one skilled in the art in the light of the principles set forth that many substitutions, such as the use of a magnetic field, may be employed.

In accordance with the invention, the wave properties of electrons in a very narrow conductor in the vicinity of a quantum well will be such that, if the conductor is narrow enough, the electrons will be quantized both perpendicular to the surface by the surface field and parallel to the surface by the lithography of the line. This gives rise to quantum levels and produces two dimensional sub-bands which may be broken into one dimension sub-bands. For each sub-band, there will be a standing wave structure, which in a sense will correspond to different modes in a waveguide.

In the heterostructure illustration of the invention, the wavelength will not be unique to the mode but will be a function of the filling of the sub-band and of the Fermi level. Though there will be a different Fermi wavelength ($\lambda_F$) for each occupied sub-band, if the separation or splitting of the sub-bands is sufficient, then most of the conduction electrons will lie on a single sub-band which in turn will have some characteristic wavelength ($\lambda$) along the line. In effect, interference effects in this case are dominated by a single channel.

In accordance with the invention, the wave properties can be utilized in an appendage in a way that is similar to the properties of photons in a waveguide.

For further clarity of explanation, the invention will be described in terms of the heterojunction that produces the quantum well at the interface of a GaAs and $Ga_{1-x}Al_xAs$ semiconductor structure and the carriers being electrons, although again in the light of the principles being set forth, other materials, structural variations and carrier types will be apparent to one skilled in the art, for example, metal insulator semiconductor structures.

Figure 1:
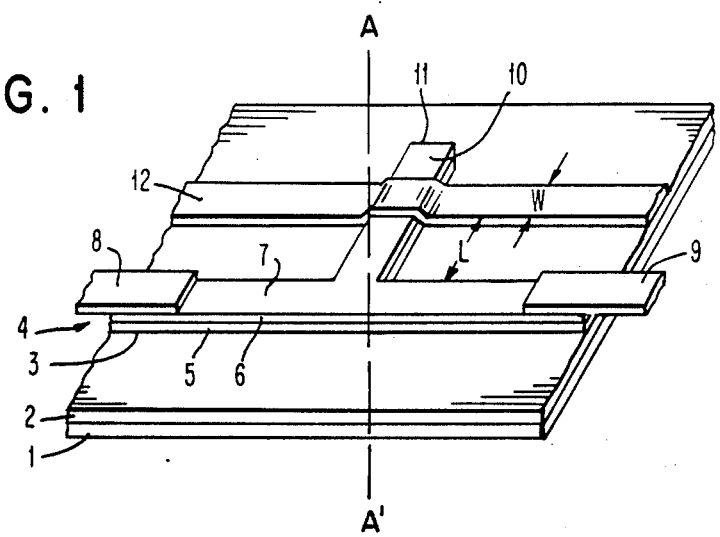
FIG. 1 is a schematic illustration of the electron tuned quantum well device of the invention.

In FIG. 1 there is provided a schematic diagram of the elements of the invention in general functional relationship.

Referring to FIG. 1, a buffer layer 1 is provided of doped GaAs on a substrate, not shown. Epitaxial therewith there is a layer of doped GaAs 2. The layer 2 forms a heterojunction 3 with a region of a semiconductor 4 having a different energy band separation, of $Ga_{1-x}Al_xAs$. The $Ga_{1-x}Al_xAs$ in turn has an undoped layer 5 and a highly doped layer 6. Layers 5 and 6 are present only in the shape of the conductor path labeled 7. The heterojunction material properties are such that a quantum well or potential well exists on the side of the heterojunction interface away from the surface. The quantum well or potential well contains a carrier concentration sometimes referred to in the art as an electron gas. The conductor path 7 has an input contact 8 and an output contact 9.

In accordance with the invention, the conductor path 7 and the layers 5 and 6 are provided with an appendage or branch 10. The appendage or branch 10 has a specific length labelled L providing reflectance properties. The appendage has an end or terminus 11.

A gate 12 is provided over the appendage 10, having a control width labelled W.

By impressing a voltage signal relative to the gate contact 12, an electrical field perpendicular to the heterojunction 3 is applied.

In a structure, as shown in FIG. 1, a signal in conductor 7 between input 8 and output 9 will have quantized electrons in the quantum well. In the appendage 10 with the terminus 11, the electrons entering the appendage 10 are reflected off the terminus 11. The wavelengths of the electrons as they pass under the gate 12 will be modified and thus the current in conductor 7 will be modified. The modification takes place when an electric field is applied through gate 12.

This takes place because with a heterojunction, such as between 1 and 2 in FIG. 1, the electrons in the quantum well at the heterojunction interface will have a wave nature with essentially no loss of phase over relatively large distances since the mean free path of the electrons with respect to any scattering phenomenon can be longer than the critical dimensions of the structure involved. For the illustration, the mean free path is of the order of 10 micrometers in typical GaAs-GaAlAs heterostructures.

It should be noted, however, that a semiconductor structure employing the principles of the invention should have a size less than the mean free path for the scattering of electrons.

In the GaAs-Ga$_{1-x}$Al$_x$As device, electrons move in waves in the potential well adjacent to the heterojunction under the conductor 7 and where semiconductor material with a long electron mean free path is employed, the appendage 10 may have a length L of the order of the mean free path length. Under these conditions, the electric field applied by a signal on element 12 over a width W will change the electron wave length over a portion of the appendage which will in turn by reflection produce constructive or destructive interference in a signal in standing wave under the conductor path. The wavelength in the appendage is modified both before and after reflection from the terminus 11 so that the total length of the modification is 2W.

Figure 2:
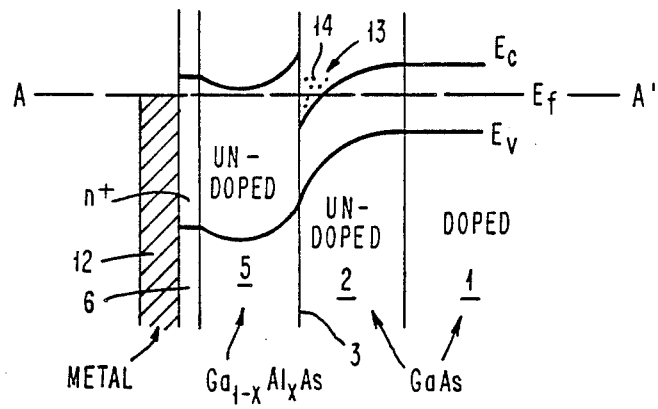
FIG. 2 is an energy diagram correlated with the structure illustrating the quantum well.

Referring next to FIG. 2, there is shown an energy diagram of the structure employing the principles of the invention taken along the line A-A' of FIG. 1. In the illustration of FIG. 2 the energy bands of the structure are shown for the regions identified by the reference numerals in FIG. 1.

The metal electrode is gate 12. The Ga$_{1-x}$Al$_x$As region 4 has a modulation doped n+ high conductivity layer 6 and an undoped layer 5 adjacent the heterojunction 3. The undoped GaAs layer 2 at the heterojunction 3 is in turn separated from a substrate that is not shown by a buffer layer of doped GaAs.

The energy band structure at the heterojunction 3 between semiconductor materials with different band gaps, that is, between the undoped Ga$_{1-x}$Al$_x$As layer 5 and the undoped GaAs layer 2, is such that the conduction band discontinuity produces the quantum well or potential well labelled element 13 in which there is a carrier or electron concentration called an electron gas labelled element 14.

In accordance with the invention, the magnitude of the electron gas and the performance of the wave behavior of the gas can be controlled by a signal applied to an appendage. The signal operates to change the Fermi level with respect to the potential well.

Figure 3:
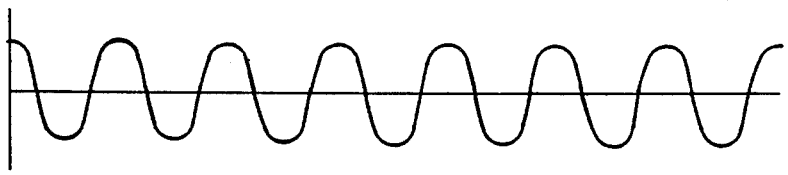
FIG. 3 is a schematic illustration of a traveling electron wave in a quantum well type structure.
Figure 4:
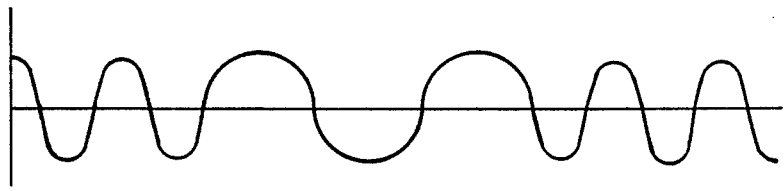
FIG. 4 is a schematic illustration of the effect of a reflected wave on the traveling wave.

In FIG. 3, there is a schematic illustration of the wave. When an electric field is applied in the appendage 10, a reflected wave occurs that results in the localized distortion of the wave in FIG. 3 as is illustrated for destructive interference in FIG. 4.

For constructive interference, the wave emerging from the appendage 10 must be in phase with the wave approaching the appendage 10. This means that there can be no phase shift within the appendage. The interference that produces the distortion illustrated in FIG. 4 arises from the interference of the electron wave that continues along under the conductor 7 and that which proceeds up the appendage under 10 and returns to the wave under the conductor 7.

The general condition for constructive interference is as set forth in Equation 1.

$$2W(1/\lambda_0 - 1/\lambda_1) = \pm n \qquad \text{Eq. 1}$$

and for destructive interference is as set forth in Equation 2.

$$2W(1/\lambda_0 - 1/\lambda_1) = \pm n + \tfrac{1}{2} \qquad \text{Eq. 2}$$

where
W is the length of the appendage under the gate,
$\lambda_0$ is the Fermi wavelength in the channel and the appendage except under the gate,
$\lambda_1$ is the wavelength under the gate 12 and
n is an integer
Thus, where
W were to be 1,000 Angstroms, and
$\lambda_0$ were to be 280 Angstroms,
then for destructive interference, $\lambda_1$ would be 262 Angstroms or 305 Angstroms. Destructive interference corresponds to a minimum current from 8 to 9 whereas constructive interference would correspond to a maximum.

BEST MODE FOR CARRYING OUT THE INVENTION

In the structure of the invention, referring to FIG. 1, the region 2 would be undoped GaAs. The region 1 would be GaAs doped with Si to $10^{17}$ atoms per cubic centimeter. The layers 5 and 6 would be Ga$_{0.35}$Al$_{0.65}$As doped in layer 6 with Si to $10^{17}$ atoms per centimeter cubed. Layer 5 would be undoped. The typical thickness for layer 5 would be 300 Angstroms and for layer 6 would be 100 Angstroms. The length L would be 2,000 Angstroms and the width W would be 1,000 Angstroms to provide an assumption for calculation simplicity that L is the equivalent of 2W.

The Fermi level of energy of the electrons would be given by Equation 3.

$$E_F = \frac{\hbar^2 k_F^2}{2m} = \frac{\hbar^2 (2\pi)^2}{2m \lambda_F^2} \qquad \text{Eq. 3}$$

where
$k_F$ and $\lambda_F$ are the wave vectors and wavelengths at the Fermi surface,
m is the electron effective mass, and
$\hbar$ is Planck's constant divided by $2\pi$.
In an illustrative example, assume that the carrier concentration, $N_S$, in the quantum or potential well under conductor 7 is $8 \times 10^{11}$ cm$^{-2}$, and that L is as assumed = 2000 Å, then Equation 4 is employed to determine the $\lambda_1$ wavelength.

$$\lambda_0 = 2000 \frac{10^{12} \tfrac{1}{2}}{N_S} = 280 \text{Å} \qquad \text{Eq. 4}$$

To produce destructive interference the wavelength $\lambda_1$ which is under the gate 12, is changed by converting, using Eq. 1, to $$\lambda_1 = \frac{L}{\frac{L}{\lambda_0} \pm \tfrac{1}{2}} \qquad \text{Eq. 5}$$

where the + corresponds to the two destructive interference conditions adjacent to the constructive peak. Under these conditions then $\lambda_1 = 262$ Å or 305 Å for the + or − sign, respectively.

The new values of $N_S$ under the gate 12 can be calculated from Eq. 4 and would be $9.1 \times 10^{11}$ cm$^{-2}$ or $6.7 \times 10^{11}$ cm$^{-2}$, respectively. Thus an increase of $N_S$ of $1.1 \times 10^{11}$ cm$^{-2}$ or a decrease of $1.3 \times 10^{11}$ cm$^{-2}$ can cause the device to change from constructive to destructive interference.

Assuming the thickness of the $Ga_{1-x}Al_xAs$ element 5 to be 400 Å, then a voltage, $V_g$, of $+0.064$ V or $-0.075$ V, respectively, would change the interference condition to produce respectively constructive or destructive interference.

The gain of the device is dependent on the degree to which perfect interference is achieved. If the interference were perfect, the transmission, T, would be unity for constructive and zero for destructive interference. Any scattering would make both tend toward 0.5.

As an illustration, assuming T were to be $=0.9$ for constructive and 0.1 for destructive interference, which is less than perfect interference, then the resistance, R, of the device can be determined using the Landauer formula described in the IBM Journal of Research and Development, July 1957, page 223, as set forth in Equation 6, or some modification thereof taking account of multiple channels.

$$R = \frac{\pi \hbar}{e^2} \frac{(1-T)}{T} \quad \text{Eq. 6}$$

For constructive or destructive interference R would respectively be $1.4 \times 10^3$ or $1.1 \times 10^5$ ohms. If a drain voltage, $V_D$, were applied between ends 8 and 9 of conductor 7 in FIG. 1, then the current, $I_D$, would be $V_D/R$.

Where $V_2 = 0.1V$, and $R = 1.4 \times 10^3$ or $1.1 \times 10^5$ the current would be $7 \times 10^{-5}$ amps or $9 \times 10^{-7}$ amps for a change of gate voltage, $V_g$, of about 0.07V.

This represents a transconductance of about 1 millisieman.

Greater or less gain would be achieved by changing L, by changing W, by changing the $Ga_{1-x}Al_xAs$ thickness, by changing T, or by changing $V_D$.

It should be noted however that the values illustrated are only approximate since Equation 6 is designed around a one dimensional situation but the analysis is sufficient to make the principles clear.

The lower the temperature, the easier to get a long mean free path.

Where the shift of phase is $2\pi$ radians, n changes by 1 in Equation 1, the conductance goes through a maximum and a minimum, and such a condition will provide the basis for a frequency multiplier.

In the light of the above principles of providing carriers in a potential well at a heterointerface under a conductor and then changing the wave behavior of the carriers by a reflected wave altered by a localized electric field, it will be apparent to one skilled in the art that many substitutions and changes to the structure may be made. As examples, it will be apparent that multiple gates in separate paths for logic may be used and the device may be used for frequency multiplication.

Having thus described our invention, what we claim as new and desire to secure by Letters Patent is:

1. In a signal translator which includes a single conducting path of given length on the surface of a semiconductor member of layers of $Ga_{1-x}Al_xAs$ on GaAs said member having a heterojunction therein and a potential well containing electrons adjacent said heterojunction, said GaAs being undoped and separated from a substrate by a buffer layer of GaAs doped with Si to $10^{17}$ atom/cm$^3$ and said $Ga_{1-x}Al_xAs$ being undoped adjacent said heterojunction and having a region at the surface of $Ga_{0.35}Al_{0.65}As$ doped with Si to $10^{17}$ atoms/cm$^3$, the improvement comprising a tunable stub having a length dimension (L) of 2000 Å connected to and extending from said path at a location along said given length and gate means having a width dimension (W) of 1000 Å for providing a localized electric field across said heterojunction under a portion of said tunable stub the latter having a length less than the means free path length for the scattering of electrons in said second semiconductor material.

* * * * *